(12) United States Patent
Meier et al.

(10) Patent No.: US 11,922,050 B2
(45) Date of Patent: Mar. 5, 2024

(54) HOST REFRESH CONTROL

(71) Applicant: Micron Technology, Inc., Boise, ID (US)

(72) Inventors: Nathaniel J. Meier, Boise, ID (US); Geoffrey B. Luken, Boise, ID (US); Markus H. Geiger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 86 days.

(21) Appl. No.: 17/512,987

(22) Filed: Oct. 28, 2021

(65) Prior Publication Data
US 2022/0197542 A1    Jun. 23, 2022

Related U.S. Application Data

(60) Provisional application No. 63/127,871, filed on Dec. 18, 2020.

(51) Int. Cl.
*G06F 3/06* (2006.01)
*G06F 13/16* (2006.01)
*G11C 11/406* (2006.01)

(52) U.S. Cl.
CPC .......... *G06F 3/0655* (2013.01); *G06F 3/0604* (2013.01); *G06F 3/0679* (2013.01); *G06F 13/1636* (2013.01); *G06F 13/1668* (2013.01); *G11C 11/40611* (2013.01)

(58) Field of Classification Search
None
See application file for complete search history.

(56) References Cited

U.S. PATENT DOCUMENTS

| | | | |
|---|---|---|---|
| 2014/0013036 A1* | 1/2014 | Kwon | G11C 5/04 713/2 |
| 2014/0258786 A1* | 9/2014 | Resnick | G11C 7/1045 714/42 |
| 2017/0031857 A1* | 2/2017 | Qiu | G06F 13/4282 |
| 2019/0370194 A1* | 12/2019 | Prather | G06F 3/0673 |
| 2020/0012436 A1* | 1/2020 | Lim | G06F 3/0659 |
| 2020/0381040 A1 | 12/2020 | Penney et al. | |
| 2021/0057022 A1 | 2/2021 | Jenkinson | |

* cited by examiner

*Primary Examiner* — Charles J Choi
(74) *Attorney, Agent, or Firm* — Brooks, Cameron & Huebsch, PLLC (57) ABSTRACT

A memory device can be operated with a set of refresh control features. A host can access the memory device to discover the set of refresh control features. The host can command the memory device to change at least one of the set of refresh control features. The memory device can be operated with the original and/or changed set of refresh control features.

20 Claims, 8 Drawing Sheets

| MR | OP[7] | OP[6] | OP[5] | OP[4] |
|---|---|---|---|---|
| 209 | | | DQU2 DFE Tap-1 Bias | |
| 210 | | | DQU2 DFE Tap-2 Bias | |
| 211 | | | DQU2 DFE Tap-3 Bias | |
| 212 | | | DQU2 DFE Tap-4 Bias | |
| 213 | DQU2 IBCLK Sign | RFU | DQU2 DCA for IBCLK | |
| 214 | DQU2 $V_{REFDQ}$ Sign | DQU2 $V_{REFDQ}$ Offset | | |
| 215 | RFU | | | |
| 216 | RFU | | | |
| 217 | | | DQU3 DFE Tap-1 Bias | |
| 218 | | | DQU3 DFE Tap-2 Bias | |
| 219 | | | DQU3 DFE Tap-3 Bias | |
| 220 | | | DQU3 DFE Tap-4 Bias | |
| 221 | DQU3 IBCLK Sign | RFU | DQU3 DCA for IBCLK | |
| 222 | DQU3 $V_{REFDQ}$ Sign | DQU3 $V_{REFDQ}$ Offset | | |
| 223 | RFU | | | |
| 224 | RFU | | | |
| 225 | | | DQU4 DFE Tap-1 Bias | |
| 226 | | | DQU4 DFE Tap-2 Bias | |
| 227 | | | DQU4 DFE Tap-3 Bias | |
| 228 | | | DQU4 DFE Tap-4 Bias | |
| 229 | DQU4 IBCLK Sign | RFU | DQU4 DCA for IBCLK | |
| 230 | DQU4 $V_{REFDQ}$ Sign | DQU4 $V_{REFDQ}$ Offset | | |
| 231 | RFU | | | |
| 232 | RFU | | | |
| 233 | | | DQU5 DFE Tap-1 Bias | |
| 234 | | | DQU5 DFE Tap-2 Bias | |
| 235 | | | DQU5 DFE Tap-3 Bias | |
| 236 | | | DQU5 DFE Tap-4 Bias | |
| 237 | DQU5 IBCLK Sign | RFU | DQU5 DCA for IBCLK | |
| 238 | DQU5 $V_{REFDQ}$ Sign | DQU5 $V_{REFDQ}$ Offset | | |
| 239 | RFU | | | |
| 240 | RFU | | | |

| OP[3] | OP[2] | OP[1] | OP[0] |
|---|---|---|---|
| DQU2 DFE Tap-1 Bias ||||
| DQU2 DFE Tap-2 Bias ||||
| DQU2 DFE Tap-3 Bias ||||
| DQU2 DFE Tap-4 Bias ||||
| DQU2 CLK Sign | RFU | DQU2 DCA for QCLK ||
| DQU2 QBCLK Sign | RFU | DQU2 DCA for QBCLK ||
| RFU ||||
| DQU3 DFE for Gain Bias ||||
| DQU3 DFE Tap-1 Bias ||||
| DQU3 DFE Tap-2 Bias ||||
| DQU3 DFE Tap-3 Bias ||||
| DQU3 DFE Tap-4 Bias ||||
| DQU3 CLK Sign | RFU | DQU3 DCA for QCLK ||
| DQU3 QBCLK Sign | RFU | DQU3 DCA for QBCLK ||
| RFU ||||
| DQU4 DFE for Gain Bias ||||
| DQU4 DFE Tap-1 Bias ||||
| DQU4 DFE Tap-2 Bias ||||
| DQU4 DFE Tap-3 Bias ||||
| DQU4 DFE Tap-4 Bias ||||
| DQU4 CLK Sign | RFU | DQU4 DCA for QCLK ||
| DQU4 QBCLK Sign | RFU | DQU4 DCA for QBCLK ||
| RFU ||||
| DQU5 DFE for Gain Bias ||||
| DQU5 DFE Tap-1 Bias ||||
| DQU5 DFE Tap-2 Bias ||||
| DQU5 DFE Tap-3 Bias ||||
| DQU5 DFE Tap-4 Bias ||||
| DQU5 CLK Sign | RFU | DQU5 DCA for QCLK ||
| DQU5 QBCLK Sign | RFU | DQU5 DCA for QBCLK ||
| RFU ||||
| DQU6 DFE for Gain Bias ||||

FIGURE 4A (left margin) — 446

HOST REFRESH CONTROL

PRIORITY INFORMATION

This application claims the benefit of U.S. Provisional Application No. 63/127,871, filed Dec. 18, 2020, the contents of which are incorporated by reference.

TECHNICAL FIELD

The present disclosure relates generally to memory devices, and more particularly, to apparatuses and methods related to a host refresh control.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Various computing systems include a number of processing resources that are coupled to memory (e.g., a memory system), which is accessed in association with executing a set of instructions (e.g., a program, applications, etc.). Data stored in memory can be of various types and can often include sensitive data such as passwords and personal information. Data stored in memory can become less reliable over time due to degradation mechanisms such as charge leakage and/or disturb mechanisms associated with accessing the cells (e.g., reading, writing, erasing, etc.). Additionally, data stored in memory may be intentionally altered by unauthorized entities (e.g., hackers) through over-utilizing specific addresses or regions of memory, for example. Such unauthorized entities may also attempt to obtain or corrupt data, which can include sensitive data, stored in memory.

DETAILED DESCRIPTION

The present disclosure includes apparatuses and methods related to host refresh control. Host refresh control refers to the host of a memory device having some ability to control how the memory device performs refresh operations. Refresh operations are background operations common to DRAM memory devices. In DRAM, each data value (e.g., bit) is stored as the presence or absence of charge on a capacitor. As time passes, the charge can leak away and may be lost without refresh operations. For example, a DRAM cell may be refreshed by charging a capacitor serving as the charge storage structure for the cell to a particular voltage. Typically, refresh operations are controlled entirely by the memory device itself without the host. Typically, the host has no ability to control or change anything about the refresh operations.

A row disturb event refers to undesirable changes in capacitor voltages of DRAM cells of a neighboring row in response to the given row being frequently accessed. As an example, a hacker may employ row disturb events to intentionally alter data stored in memory by repeatedly accessing a particular row in rapid succession. Refreshing the cells at a faster rate (e.g., more frequently) can improve the reliability of the data stored in the memory cells by cancelling out the disturb data loss effects. However, an increased refresh rate involves increased power consumption. Memory devices are typically preconfigured with a predefined set of refresh control features prior to deployment of the memory device. However, future security vulnerabilities cannot always be predicted.

In order to address these and other issues associated with some previous approaches, at least one embodiment of the present disclosure provide a host of a memory device with some measure of control over refresh operations of the memory device. Refresh operations can be implemented with varying parameters, referred to herein as refresh control features. A refresh operation can be defined by a set of refresh control features. According to at least one embodiment of the present disclosure, the host can command the memory device to change at least one of the set of refresh control features. The changed refresh control feature can address, for example, a newly discovered security vulnerability of the memory device associated with row disturb attacks. Additional embodiments and advantages are described in more detail below.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 210 may reference element "10" in FIG. 2, and a similar element may be referenced as 310 in FIG. 3. Analogous elements within a Figure may be referenced with a hyphen and extra numeral or letter. Such analogous elements may be generally referenced without the hyphen and extra numeral or letter. For example, elements 108-1, 108-2, 108-3, and 108-M in FIG. 1 may be collectively referenced as 108. As used herein, the designators "M" and "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
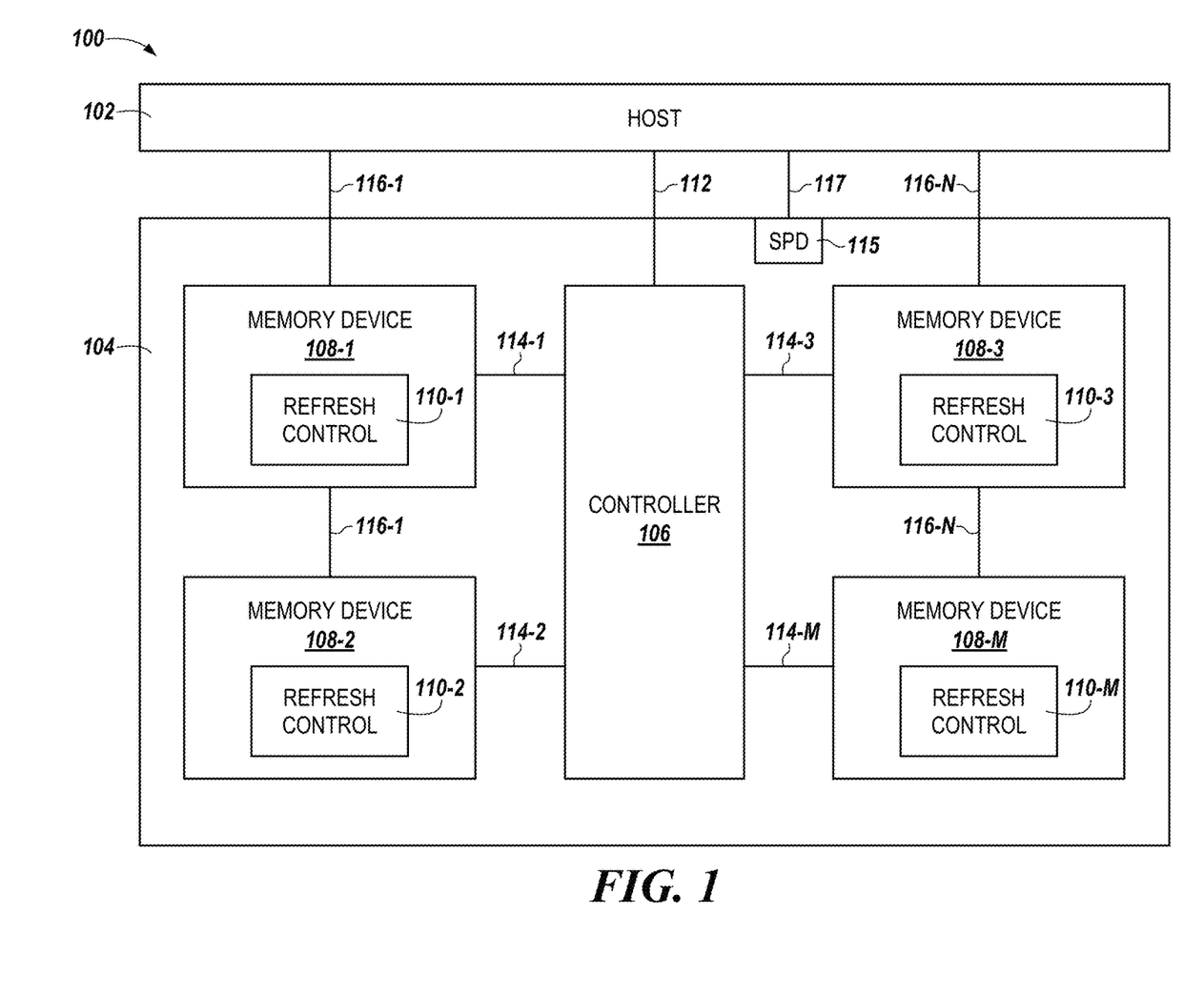
FIG. 1 is a block diagram of an apparatus in the form of a computing system including a memory system having memory devices with refresh control circuitry according to the present disclosure.

FIG. 1 is a block diagram of an apparatus in the form of a computing system 100 including a host 102 and a memory system 104 having memory devices 108-1, 108-2, 108-3, . . . , 108-M with refresh control circuitry 110-1, 110-2, 110-3, . . . , 110-M according to the present disclosure. As used herein, a computing system 100, a host 102, a memory system 104, or a memory device 108, for example, might also be separately considered to be an "apparatus. In this example, the computing system 100 includes the host 102 coupled to the memory system 104 via an interface. The interface can pass control, address, data, and other signals between the memory system 104 and the host 102. The interface can include a command/address bus 112 and data buses 116-1, . . . , 116-N. In some embodiments, the command/address bus 112 can be comprised of separate command and address buses. In some embodiments, the command/address bus 112 and the data buses 116 can be part of a common bus. The command/address bus 112 can pass signals from the host 102 to the controller 106 such as clock signals for timing, reset signals, chip selects, addresses for the memory devices 108, parity information, etc. The command/address bus 112 can be used by the controller 106 to send alert signals to the host 102. The command/address bus 112 can be operated according to a protocol. The interface can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some cases, the controller 106 is a register clock driver (RCD), such as RCD employed on an RDIMM or LRDIMM. In some embodiments, the memory system 104 includes a serial presence detect (SPD) hub 115 or simply "hub," which may include a temperature sensor, clock functionality, isolation circuitry (e.g., an ability to isolate a bus on the module, such as a bus or buses 114) from other buses or from the host 102, such as via bus 112 or buses 116).

The computing system 100 can be a personal laptop computer, a desktop computer, a digital camera, a mobile telephone, a memory card reader, or an Internet-of-Things (IoT) enabled device, among various other types of systems. For clarity, the computing system 100 has been simplified to focus on features with particular relevance to the present disclosure. The host 102 can include a number of processing resources (e.g., one or more processors, microprocessors, or some other type of controlling circuitry) capable of accessing the memory system 104. In some embodiments, the memory system 104 and/or the memory devices 108 can be preconfigured with a predefined set of refresh control features prior to deployment of the memory system 104 (e.g., prior to sale, shipping, or use of the memory system 104). For example, the memory devices 108 each can be configured with a respective set of refresh control features and an identifier of a version of the set of refresh control features can be stored in the SPD hub 115, one or more fuses associated with the memory devices 108, and/or one or more mode registers associated with the memory devices 108, as described in more detail herein. The host 102 can be configured to read the version information from the SPD hub 115 and/or to command the memory devices 108 to read the version information from fuses or mode registers therein. In contrast to some previous approaches, the host 102 can be configured to command the memory system 104 and/or the memory devices 108 to change at least one of a set of refresh control features. Giving the host 102 some measure of control over the refresh operations allows the refresh operations to be updated after the memory devices 108 have been deployed (e.g., by a customer) in the field, such as in response to a newly detected vulnerability associated with the default refresh operations of the memory devices 108.

The memory system 104 can provide main memory for the computing system 100 or could be used as additional memory or storage throughout the computing system 100. Each memory device 108 can be a separate memory die, which may also be referred to as a chip. Each memory device 108 can include one or more arrays of memory cells. By way of example, the memory system 104 can be a dual in-line memory module (DIMM) including memory devices 108 operated as double data rate (DDR) DRAM, such as DDR5, a graphics DDR DRAM, such as GDDR6, or another type of memory system. Embodiments are not limited to a particular type of memory system 104. Other examples of memory devices 108 include RAM, ROM, SDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. The memory devices 108-1, 108-2 are coupled to the first data bus 116-1. The memory devices 108-3, 108-M are coupled to the second data bus 116-N. A data bus 116 can provide data for read/write operations between the host 102 and the memory system 104.

The memory system 104 can include a controller 106 coupled to the memory devices 108 via respective buses 114-1, 114-2, 114-3, 114-M. The buses 114 can be referred to as internal command/address buses 114 (e.g., internal to the memory system 104, as opposed to the command/address bus 112 between the host 102 and the memory system 104). The controller 106 can be implemented as hardware, firmware, and/or software. For example, the controller 106 can be an application specific integrated circuit (ASIC) coupled to a printed circuit board including a physical interface. The controller 106 can thereby relay command and/or address signals from the command/address bus 112 from the host 102 to the memory devices 108. In some embodiments, the controller 106 may perform command and/or address translation of the command and/or address signals from the host 102 before relaying the same to the memory devices 108. The controller 106 may operate the command/address buses 114 with a same or different protocol than that with which the command/address bus 112 is operated between the host 102 and the memory system 104. The controller 106 can use the buses 114 to send command and/or address signals, clock signals, select signals, and other related signals to the memory devices 108. The memory devices 108 can use the buses 114 to send error signals, reset signals, and other related signals to the controller 106. The controller 106 thus provides access to the memory devices 108 for the host 102. Examples of the commands for the memory devices 108 include read, write, erase, refresh, and refresh management commands for data on the memory devices 108, among other commands. The memory system 104 can include separate integrated circuits, or both the controller 106 and the memory devices 108 can be on the same integrated circuit.

The memory devices 108 are each illustrated as including refresh control circuitry 110. The refresh control circuitry 110 can control refresh operations on the respective memory device 108 with which it is associated. Different refresh operations can be defined by different sets of refresh control features. Different refresh operations can be wholly different (e.g., where each of the set of refresh control features are different) or similar (e.g., where one or a few of the set of refresh control features are different). Similar refresh operations having one or a few different refresh control features can be referred to as different versions of a refresh operation when the memory device is configured to operate with the different versions of the refresh operation (and the different sets of refresh control features). An identifier of a version of the set of refresh control features can be stored in association with the memory device 108, such as in a mode register or fuse of the memory device 108 and/or in the SPD hub 115 of a memory system 104 including the memory device 108. The refresh control circuitry 110 is described in more detail with respect to FIGS. 2-3.

Figure 2:
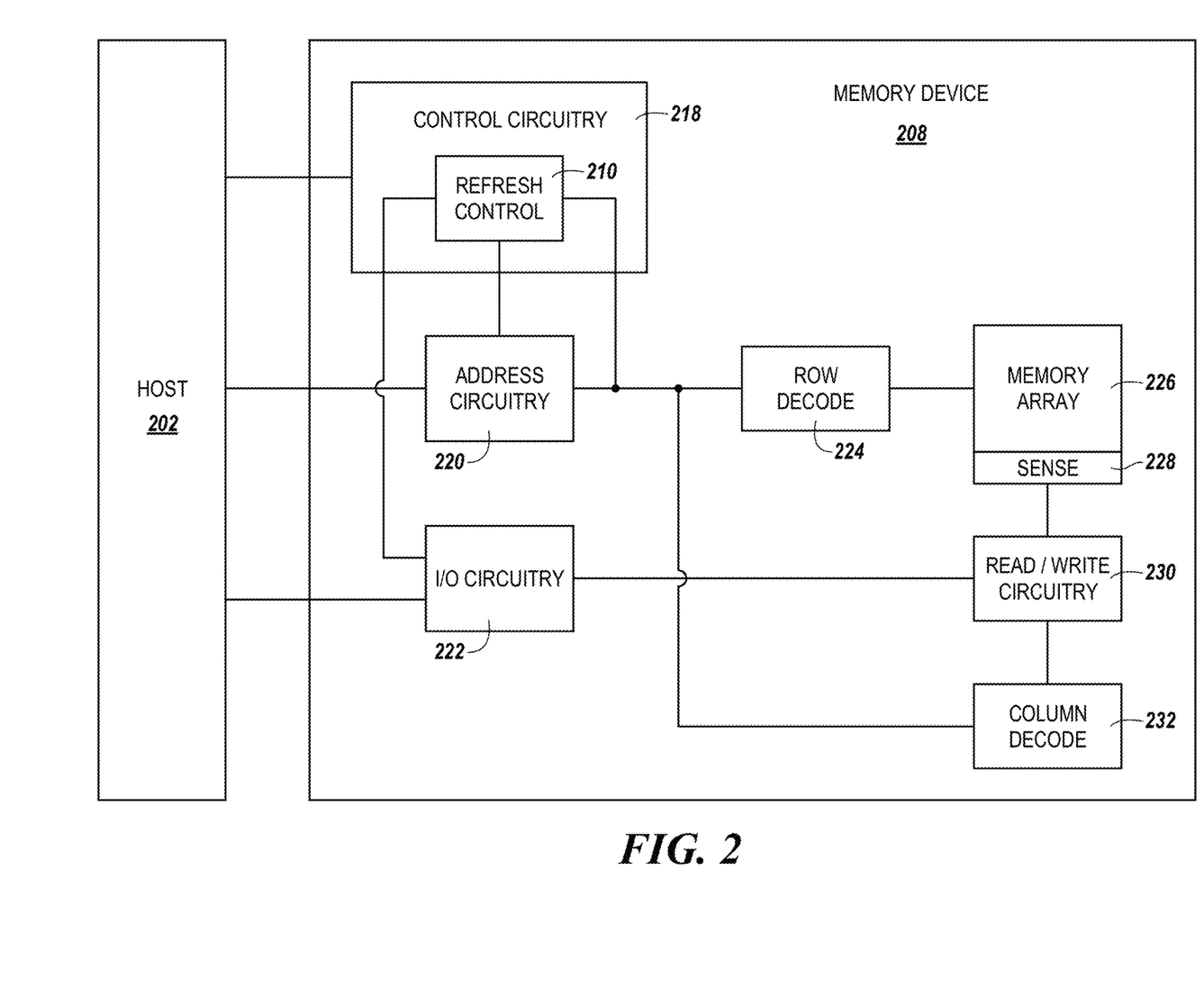
FIG. 2 is a block diagram of an apparatus in the form of a memory device with refresh control circuitry according to the present disclosure.

FIG. 2 is a block diagram of an apparatus in the form of a memory device 208 with refresh control circuitry 210 according to the present disclosure. The memory device 208 is analogous to any of the memory devices 108 illustrated in FIG. 1 and is coupled to a host 202. The control circuitry 218 decodes signals provided by the host 202 or a controller (not specifically illustrated). The control circuitry 218 can also be referred to as a command input and control circuit and can represent the functionality of different discrete ASICs or portions of different ASICs depending on the implementation. The signals can be commands provided by the host 202. These signals can include chip enable signals, write enable signals, and address latch signals, among others, that are used to control operations performed on the memory array 226. Such operations can include data read operations, data write operations, data erase operations, data move operations, etc. In various embodiments, the control circuitry 218 is responsible for executing instructions from the controller. The control circuitry 218 can comprise a state machine, a sequencer, and/or some other type of control circuitry, which may be implemented in the form of hardware, firmware, or software, or any combination of the three.

Data can be provided to and/or from the memory array 226 via data lines coupling the memory array 226 to input/output (I/O) circuitry 222 via read/write circuitry 230. The I/O circuitry 222 can be used for bi-directional data communication with the host 202 over an interface. The read/write circuitry 230 is used to write data to the memory array 226 or read data from the memory array 226. As an example, the read/write circuitry 230 can comprise various drivers, latch circuitry, etc. In some embodiments, the data path can bypass the controller (e.g., the controller 106 illustrated in FIG. 1).

The memory device 208 includes address circuitry 220 to latch address signals provided over an interface. Address signals are received and decoded by a row decoder 224 and a column decoder 232 to access the memory array 226. Data can be read from memory array 226 by sensing voltage and/or current changes on the sense lines using sensing circuitry 228. The sensing circuitry 228 can be coupled to the memory array 226. Each memory array 226 and corresponding sensing circuitry 228 can constitute a bank of the memory device 208. The sensing circuitry 228 can comprise, for example, sense amplifiers that can read and latch a page (e.g., row) of data from the memory array 226. Sensing (e.g., reading) a bit stored in a memory cell can involve sensing a relatively small voltage difference on a pair of sense lines, which may be referred to as digit lines or data lines. Therefore, it can be beneficial to provide increased voltage differentials to be sensed. For instance, more than one storage structure (e.g., capacitor) may be used to store a particular bit value. As one example, in a one transistor one capacitor (1T1C) DRAM cell, charge corresponding to a bit value is stored on (and sensed from) a single capacitor. In contrast, in a 2T2C DRAM cell, charge is stored on (and sensed from) two capacitors via differential digit lines coupled to a sense amplifier. Therefore, a 2T2C memory cells can have an increased sense margin and can be less susceptible to adverse effects due to charge leakage, for example, as compared to 1T1C memory cells. However, memory arrays employing 2T2C cells have a reduced storage density as compared to memory arrays employing 1T1C cells.

The memory array 226 can comprise memory cells arranged in rows coupled by access lines (which may be referred to herein as word lines or select lines) and columns coupled by sense lines (which may be referred to herein as digit lines or data lines). Although the memory array 226 is shown as a single memory array, the memory array 226 can represent a plurality of memory array arraigned in banks of the memory device 208. The memory array 226 can include a number of memory cells, such as volatile memory cells (e.g., DRAM memory cells, among other types of volatile memory cells) and/or non-volatile memory cells (e.g., RRAM memory cells, among other types of non-volatile memory cells).

According to at least one embodiment of the present disclosure, the control circuitry 218 also includes refresh control circuitry 210. However, embodiments are not so limited, as some embodiments include the refresh control circuitry 210 being separate from the control circuitry 218. As illustrated, the refresh control circuitry 210 is coupled to the address circuitry 220, I/O circuitry 222, and column decode 232 and row decode 224. Commands that flow through the control circuitry 218 (e.g., from the host 202) can also flow through the refresh control circuitry 210. The refresh control circuitry 210 is described in more detail with respect to FIG. 3.

An access command from the host 202 can include one or more commands such as a pre-charge command, an activate command, a read command, and/or a write command, among other possible commands. In various embodiments, an access command can be propagated into a plurality of access commands. For example, an access command can be a read command which can be propagated into the access commands including a pre-charge command, an activate command, and a read command. According to the present disclosure, the host 202 can be configured to provide a new kind of access command to read version information and/or change at least one of a set of refresh control features of the refresh control circuitry 210. In at least one embodiment, the version information is merely an identifier of the version of the set of refresh control features with which the memory device operates. In at least one embodiment, the version information includes specific details identifying values of the set of refresh control features with which the memory device 208 operates.

In some embodiments, the version information and/or the set of refresh control features can be secured by the memory device 208. In such embodiments, an access command can be verified if the host 202 sends a valid key entry sequence prior to sending the access command for the refresh control circuitry 210. The key entry sequence can be a particular sequence of commands that can be verified against a sequence identifier stored in the memory device 208, such as in a mode register. If the key entry sequence matches the stored sequence identifier, then the memory device 208 can perform the command issued by the host 202. If the key entry sequence does not match the stored sequence identifier, then the memory device will not perform the command issued by the host 202.

In at least one embodiment, the refresh control circuitry 210 is configured to refresh the memory array 226 according to a predefined set of refresh control features. The refresh control circuitry 210 is also configured to change at least one of the predefined set of refresh control features in response to a command from a host.

Figure 3:
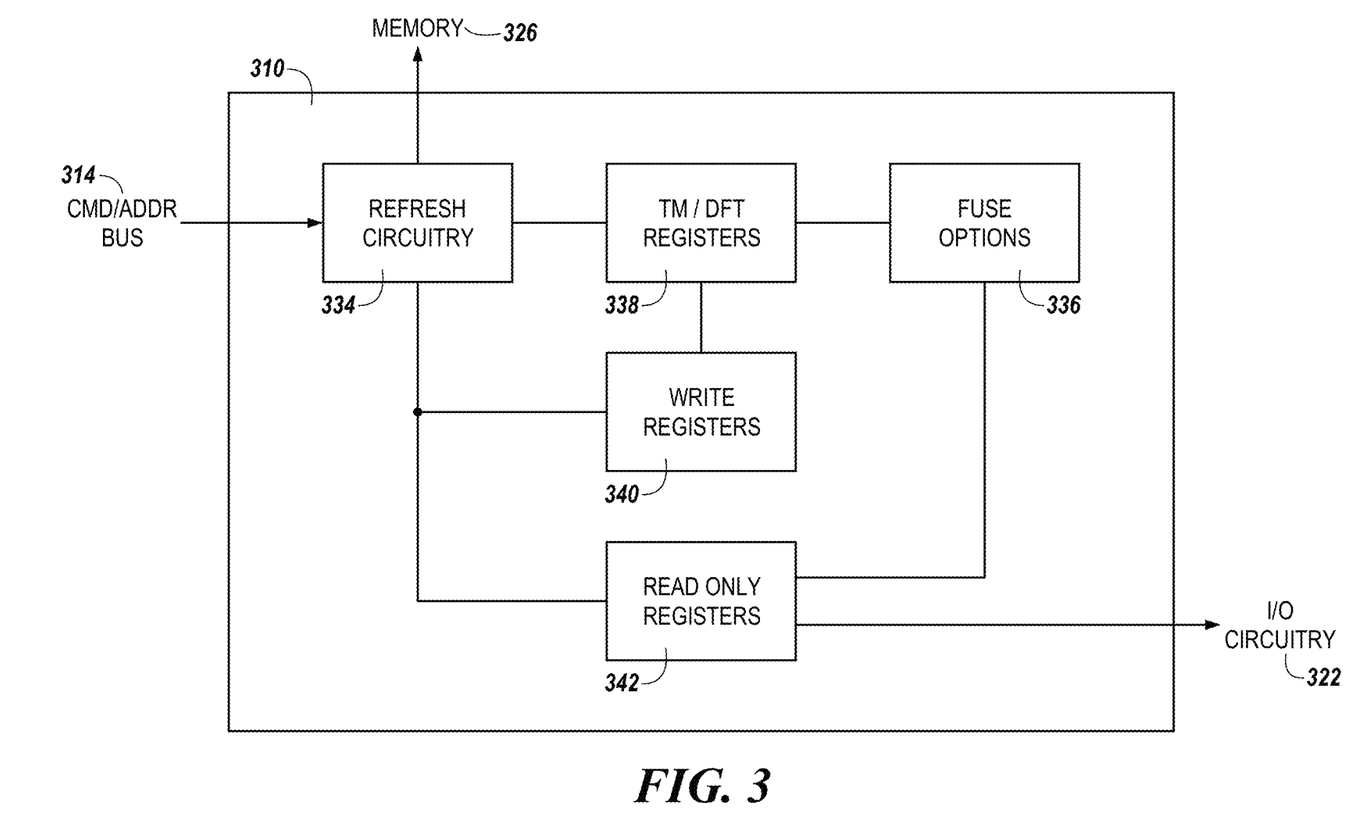
FIG. 3 is a block diagram of refresh control circuitry according to the present disclosure.

FIG. 3 is a block diagram of refresh control circuitry 310 according to the present disclosure. The refresh control circuitry 310 can be integrated with the control circuitry of a memory device as illustrated in FIG. 2 or can include one or more ASICS separate from the control circuitry of the memory device. The refresh control circuitry 310 can be coupled to the command/address bus ("Cmd/Addr Bus") 314, to the memory array 326, and to I/O circuitry 322 (e.g., via a data bus). The command/address bus 314 can be coupled to a controller (e.g., the controller 106 illustrated in FIG. 1) or a host (e.g., the host 102 illustrated in FIG. 1) while the I/O circuitry 322 can be coupled to the host.

The refresh control circuitry 310 can include refresh circuitry 334, which is responsible for controlling refresh operations of the memory array 326. The refresh control circuitry 310 can also include fuse options 336 and a number of mode registers, such as test mode/default "TM/DFT" registers 338, write registers 340, read-only registers 342, and/or an on-die storage array (not specifically illustrated). The fuse options 336 block represents fuses or anti-fuses (e.g., read only memory) that stores default settings for the memory array 326. Embodiments are not limited to the refresh control circuitry 310 including any particular quantity of registers. The refresh control circuitry 310 can include more or fewer registers than those illustrated in FIG. 3.

The TM/DFT registers 338 include control logic for test modes and configurable default settings for the memory array 326. The memory array 326 operates, at least with respect to refresh operations, based on the information stored in the TM/DFT registers 338 and as controlled by the refresh circuitry 334. The fuse options 336 can be coupled to the TM/DFT registers 338. The TM/DFT registers 338 can store configurable default settings based at least in part on the state of the fuse options 336. The state of the fuse options 336 can represent default refresh control features for the memory array 326. The TM/DFT registers 338 can, at least initially, store values indicative of the same default refresh control features as the fuse options 336 based on reading the fuse options 336 and/or receiving information from the fuse options 336.

The write registers 340 are accessible and writeable by a host. In some embodiments, the write registers 340 are accessible by the host via the refresh circuitry 334 (as illustrated). In some embodiments, the write registers 340 are accessible by the host without going through the refresh circuitry 334 (not specifically illustrated). Ultimately, the write registers 340 are accessible by the host via the command/address bus 314, whether through the refresh circuitry 334 or not. The host can cause a change to at least one of a set of refresh control features by causing the memory device to write a value indicative of the changed refresh control feature to a write register 340. The write registers 340 can transfer that information to the TM/DFT registers 338 in order to update control of the refresh operations of the memory array 326 by the refresh circuitry 334 using the changed refresh control feature.

The read-only registers 342 are accessible by the host to read an identifier of a version of the set of refresh control features used by the memory device. The command from the host to read the version identifier can be received via the command/address bus 314 either through the refresh circuitry 334 (as illustrated) or directly (not specifically illustrated). The version identifier can be transmitted to the host via the I/O circuitry 322. The version identifier can be stored in the read-only registers 342 either in lieu of or in addition to storing the version identifier in the SPD hub (e.g., SPD hub 115 illustrated in FIG. 1). The fuse options 336 can be coupled to the read-only registers 342. The read-only registers 342 can, at least initially, store values indicative of the same default refresh control features as the fuse options 336 based on reading the fuse options 336 and/or receiving information from the fuse options 336.

As described in more detail herein, in some embodiments, the host can track memory access diagnostic data for the memory array 326. In some embodiments, the memory device can track such diagnostic data. Although not specifically illustrated, the refresh control circuitry 310 can include a register that is writable by the memory device and readable by the host. The refresh control circuitry 310 can be configured to write a value indicative of the memory access diagnostic data to the register for later reading by the host so that the host can analyze the diagnostic data to detect suspicious access patterns and adjust the fresh control features used by the memory device accordingly.

Figure 4A:
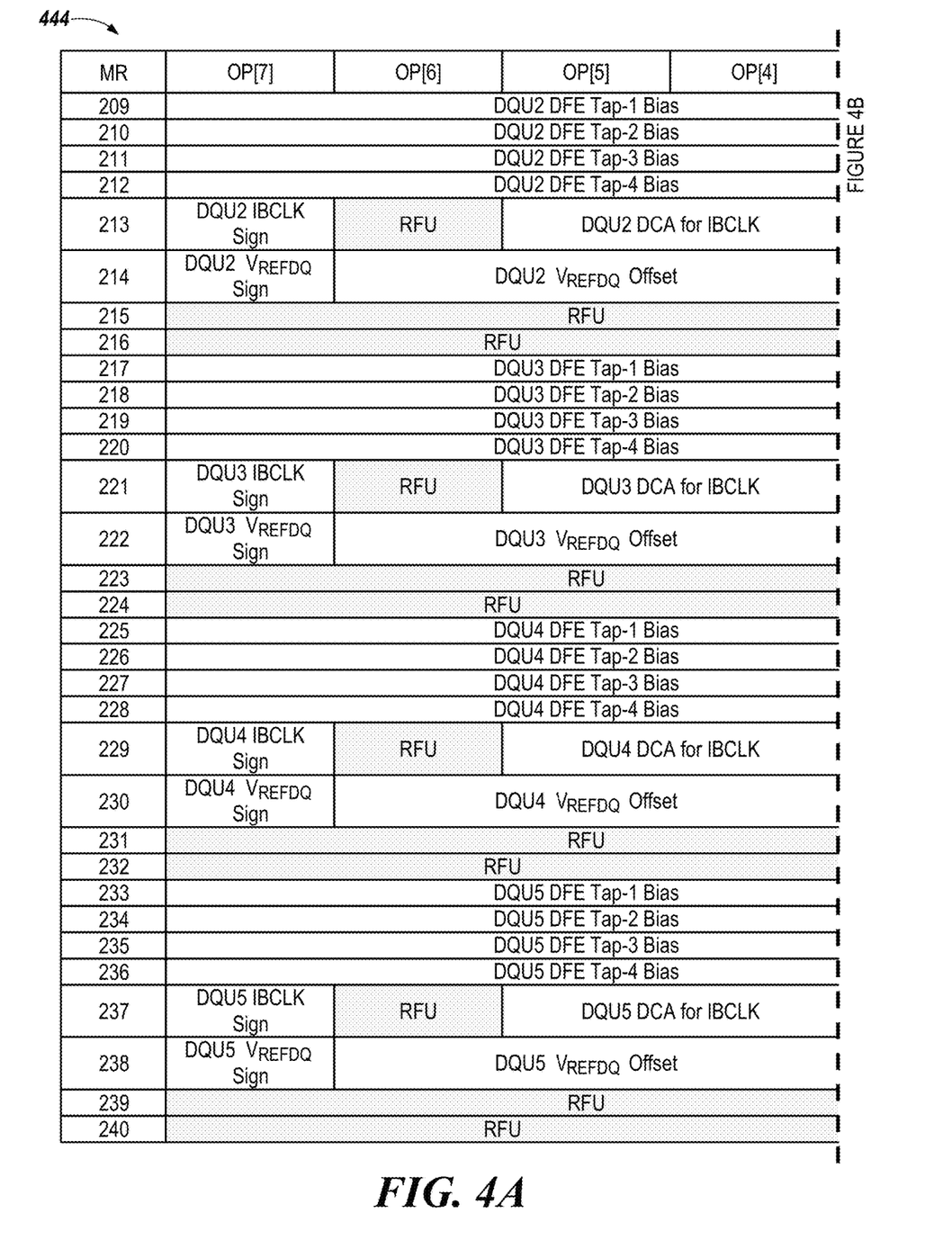
FIG. 4A is a block diagram of a number of mode registers on a memory device with refresh control circuitry according to the present disclosure.
Figure 4B:
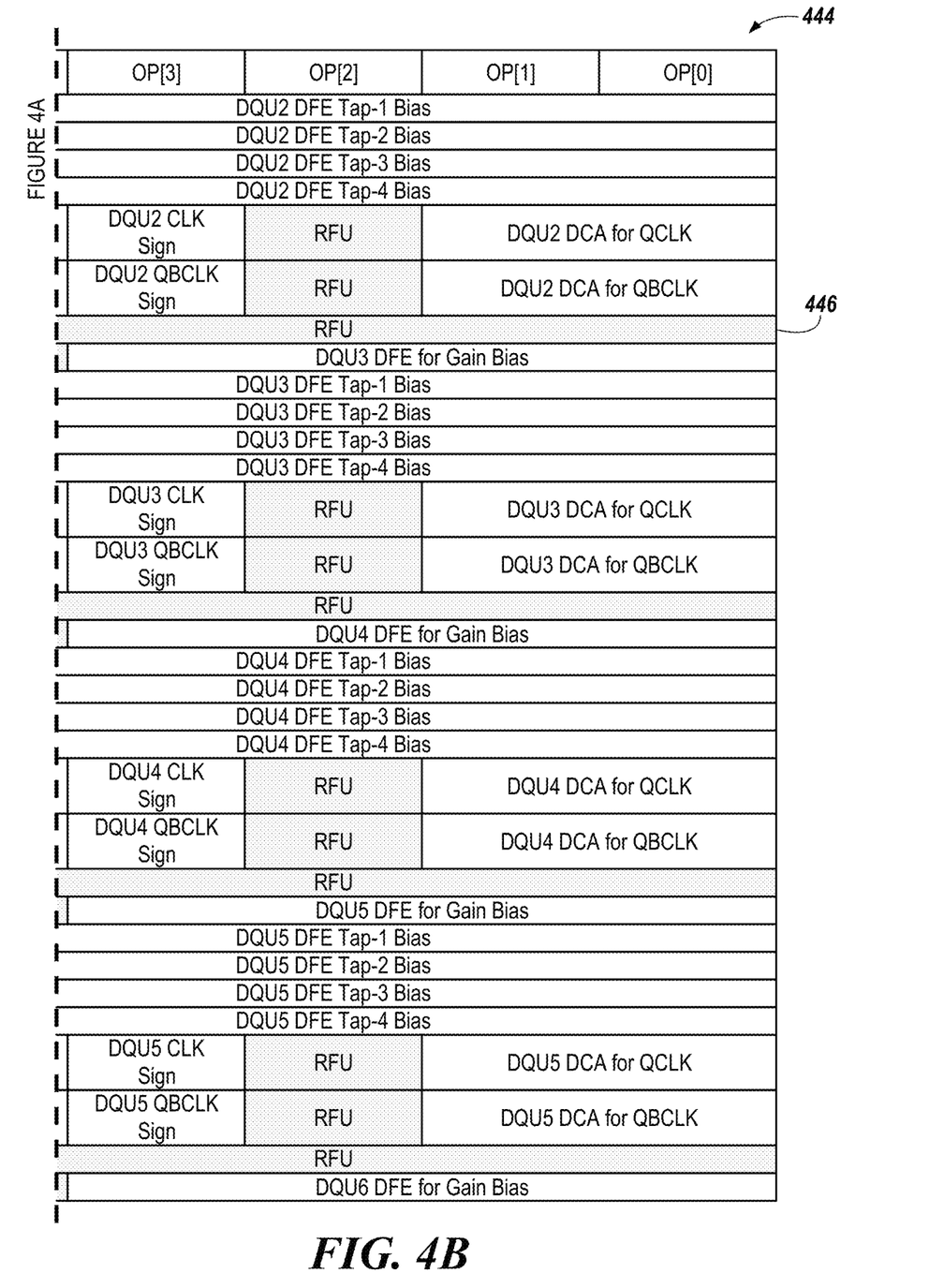
FIG. 4B is a block diagram of a number of mode registers on a memory device with refresh control circuitry according to the present disclosure.

FIGS. 4A-4B illustrate a block diagram of a number of mode registers 444 on a m memory device with refresh control circuitry according to the present disclosure. The figure is split onto two sheets due to spacing constraints. The mode registers 444 illustrated in FIGS. 4A-4B are for a DDR5 DRAM memory. The mode registers 444 can be read and/or written based on commands from a host, a controller, and/or control circuitry. The mode registers 446 labeled "RFU" indicate that they are reserved for future use. Such mode registers 446 can be used to fill the role of the mode registers described above in connection with FIG. 3 (e.g., TM/DFT registers 338, write registers 340, read-only registers 342, etc.).

Figure 5:
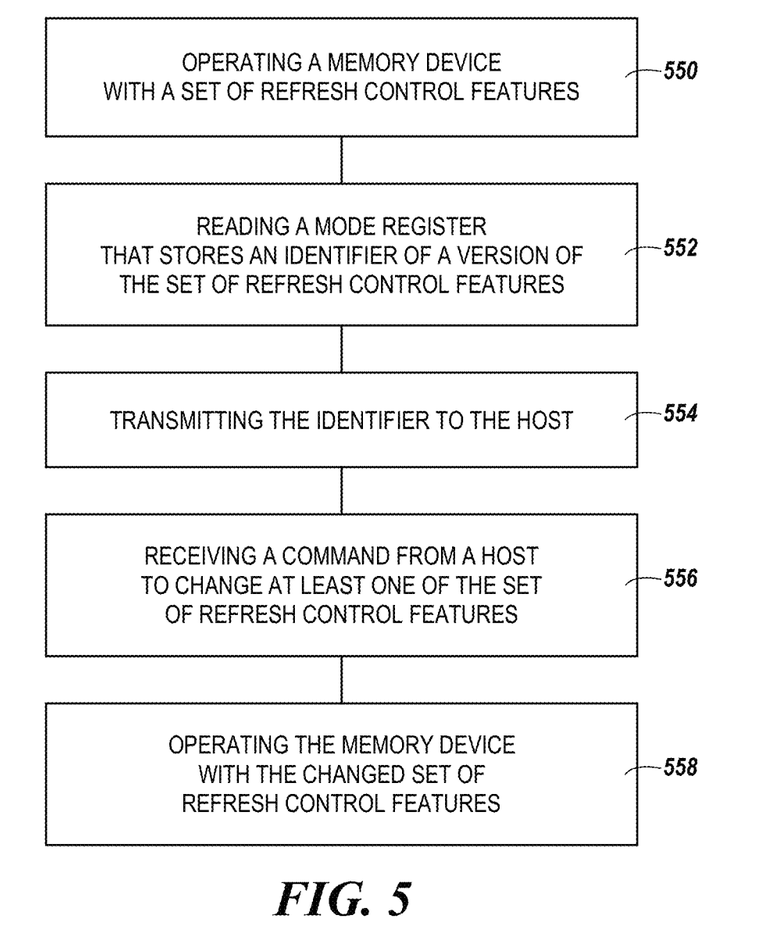
FIG. 5 is a flow diagram illustrating a method for host refresh control according to the present disclosure.

FIG. 5 is a flow diagram illustrating a method for host refresh control according to the present disclosure. The method described in FIG. 5 can be performed by, for example, refresh control circuitry, such as the refresh control circuitry 310 illustrated in FIG. 3. At block 550, the method can include operating a memory device with a set of refresh control features. At block 552, the method can include the memory device reading a mode register (e.g., TM/DFT register 338 and/or read-only mode register 342 illustrated in FIG. 3) that stores an identifier of the refresh control version. At block 554, the method can include transmitting the identifier to the host. At block 556, the method can include receiving a command from a host to change at least one of the set of refresh control features. At block 558, the method can include operating the memory device with the changed set of refresh control features. As described above, previous approaches did not provide for the host to have the ability to read and/or alter refresh control features. The memory device can also change the set of refresh control features independent of any command from the host. Such changes may be implemented periodically in order to stay ahead of attempts to take advantage of a particular set of refresh control features with a cleverly designed row disturb attack, for instance. The identifier can be written to the mode register prior to deployment of the memory device (e.g., by a manufacturer of the memory device).

Although not specifically illustrated, the method can include writing a value indicative of the changed refresh control feature to a mode register (e.g., write register 340 illustrated in FIG. 3) in response to receiving the command to change the at least one refresh control feature. In at least one embodiment, writing the value can be done in response to receiving a valid key entry sequence from the host prior to (e.g., immediately prior to) receiving the command to change the at least one refresh control feature. As described herein, such embodiments are beneficial in that the key entry sequence can be known or provided to authorized hosts of the memory device to allow such hosts to change refresh control features, while helping to prevent unauthorized entities (e.g., users, hackers, etc.) from changing refresh control features. In at least one embodiment, if another command is subsequently received from the host without being preceded by reception of the valid key entry sequence, then the memory device will not execute the subsequently received command. Likewise, if the original change command was received without being preceded by the valid key entry sequence, then the original command would not be executed. Not all embodiments employ such additional security features, which may be enabled by a programmable option in the memory device.

Figure 6:
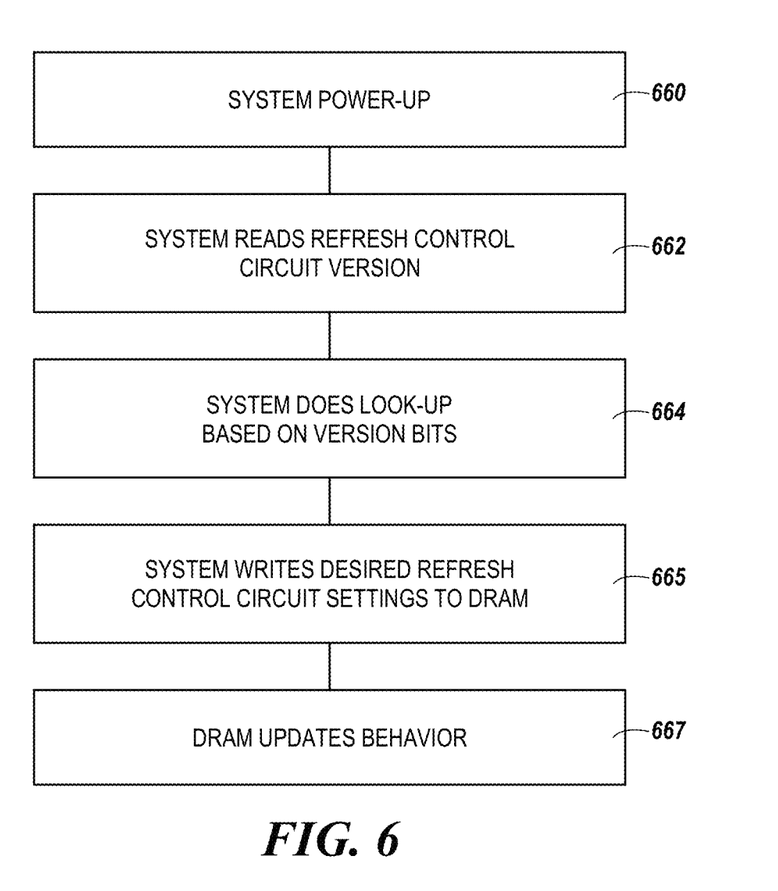
FIG. 6 is a flow diagram illustrating an example host refresh control process according to present disclosure.

FIG. 6 is a flow diagram illustrating an example host refresh control process according to present disclosure. At least a portion of the process illustrated in FIG. 6 can be performed by a host, for example, via execution of instructions stored in a machine-readable medium (e.g., software, firmware, etc.). At 660, the process starts at computing system (e.g., computing system 100 illustrated in FIG. 1) power-up. At 662, the computing system can read a refresh control circuit version, which is analogous to the version of the set of refresh control features. The host can access the version information, which embodied in an identifier indicative of a refresh control version of the memory device (e.g., memory device 208 illustrated in FIG. 2). This information can be read by the host from the SPD hub (e.g., SPD hub 115 illustrated in FIG. 1) or from read-only registers of the refresh control circuitry (e.g., refresh control circuitry 310 illustrated in FIG. 3).

At 664, the computing system can perform a lookup based on the version bits received from the memory. The host can lookup features supported by the refresh control version based on the identifier. Such information (the features supported by the refresh control version) can be provided by a manufacturer of the memory device. and used by hosts to make changes thereto. Such changes can be made, for example, with the intent to prevent future security risks or to configure the memory to specific host preferences for reasons other than security. By way of example, the manufacturer of the memory device may implement different versions of refresh control functionality with different refresh control circuits, different versions of refresh control circuits, or different memory devices. The memory refresh features used by the different memory devices, circuits, or versions thereof can be made available by the manufacturer to select (e.g., trusted) development partners. In some embodiments, the lookup information is provided to an entity that manufactures the host by the manufacturer of the memory device. In some embodiments, the lookup information can be stored in firmware of the memory device itself and accessed by the host during operation of the memory device. In such embodiments, the host can select particular features from the features supported by the refresh control version of the memory device.

At 665, the computing system can write desired refresh control circuit settings to the memory (e.g., DRAM). The host can command the memory device to use particular features supported by the refresh control version. Another reason for referencing the lookup information by the host is to confirm that a desired refresh control feature is in fact supported by the memory device before commanding the memory device to implement it. At 667, the memory device updates its behavior according to the settings written by the host.

Figure 7:
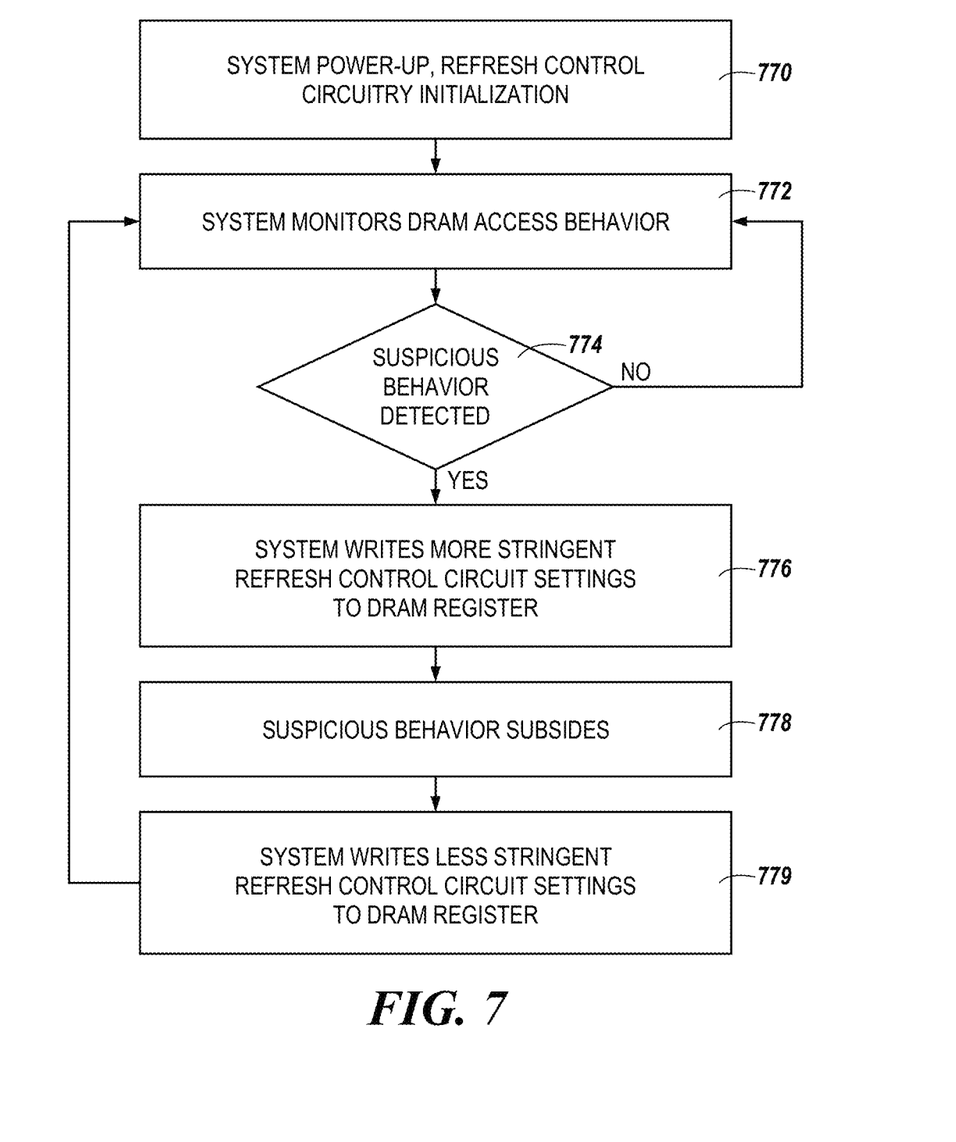
FIG. 7 is a flow diagram illustrating another example host refresh control process according to present disclosure.

FIG. 7 is a flow diagram illustrating another example host refresh control process according to present disclosure. The process illustrated in FIG. 7 is not exclusive from the process illustrated in FIG. 6. The two processes may be implemented together. At 770, at computing system power-up, the refresh control circuit of the memory device is initialized. At 772, the system can monitor access behavior to the memory device. For example, access patterns can be monitored in order to detect a suspicious access pattern or suspicious behavior as illustrated at 774. If no suspicious behavior is detected, then the memory device can continue to operate with the current or default refresh control version and/or features and the host can continue to monitor. However, if suspicious behavior is detected, then the host can command the memory device to use more restrictive features supported by the refresh control version based on the detected suspicious access pattern. Examples of suspicious behavior include heavy activity to a limited set of addresses of the memory array, extended use of specific addresses of the memory array, and a specific sequence or patterns of address accesses, among others. At 776, the host can write more stringent refresh control circuit settings to the write register of the memory device. The memory device can then operate with the new settings.

After a period of time, the suspicious behavior may subside, as indicated at 778. The host can determine that the suspicious access pattern has subsided after further monitoring access patterns. In response thereto, the host can command the memory device to use less restrictive features supported by the refresh control version. At 779, the host can write less stringent refresh control circuit settings to the write register of the memory device. In at least one embodiment, the host can command the memory device to revert to a previous refresh control feature setting in response to the suspicious activity subsiding. The memory device can then operate with the new settings.

Embodiments can include a tangible machine-readable storage medium (also known as a computer-readable medium) on which is stored one or more sets of instructions or software embodying any one or more of the methodologies or functions described herein. In some embodiments, a memory device or a processing device constitutes a machine-readable medium. The term "machine-readable storage medium" includes a single medium or multiple media that store the one or more sets of instructions. The term "machine-readable storage medium" includes any medium that is capable of storing or encoding a set of instructions for execution by the machine and that cause the machine to perform any one or more of the methodologies of the present disclosure. The term "machine-readable storage medium" includes, but is not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    operating a memory device with a set of refresh control features;
    reading a mode register that stores an identifier of a version of the set of refresh control features;
    transmitting the identifier to a host;
    receiving a command from the host to change at least one of the set of refresh control features;
    operating the memory device with the changed set of refresh control features; and
    periodically changing the set of refresh control features independent of any command from the host.

2. The method of claim 1, further comprising writing a value indicative of the changed refresh control feature to a different mode register in response to receiving the command to change the at least one refresh control feature.

3. The method of claim 1, further comprising writing the identifier to the mode register prior to deployment of the memory device.

4. The method of claim 1, further comprising:
    writing a value indicative of the changed refresh control feature to the mode register in response to receiving the command to change the at least one refresh control feature.

5. The method of claim 4, wherein writing the value comprises writing the value in response to receiving a valid key entry sequence from the host prior to receiving the command to change the at least one refresh control feature.

6. The method of claim 5, further comprising:
    receiving a subsequent command to change at least one of the set of refresh control features without receiving the valid key entry sequence from the host immediately prior to receiving the subsequent command; and
    not executing the subsequent command.

7. An apparatus, comprising:
    a memory array; and
    control circuitry coupled to the memory array and, wherein the control circuitry is configured to:
        refresh the memory array according to a predefined set of refresh control features;
        change at least one of the predefined set of refresh control features in response to a command from a host; and
        periodically change the predefined set of refresh control features independent of any command from the host.

8. The apparatus of claim 7, further comprising a serial presence detect hub that stores an identifier of a version of the set of refresh control features.

9. The apparatus of claim 7, further comprising a read-only mode register, accessible by a host, that stores an identifier of a version of the set of refresh control features.

10. The apparatus of claim 7, further comprising a writable mode register, accessible by a host to store changes to the predefined set of refresh control features; and
    wherein the control circuitry is configured to refresh the memory array according to the changed set of refresh control features.

11. The apparatus of claim 7, further comprising a writable mode register, readable by a host; and
    wherein the control circuitry is configured to write a value indicative of memory access diagnostic data to the writable mode register.

12. The apparatus of claim 7, wherein one of the set of refresh control features comprises a frequency at which the memory array is refreshed.

13. A non-transitory machine-readable medium storing instructions executable to cause a machine to:
    access an identifier indicative of a refresh control version of a memory device;
    lookup features supported by the refresh control version based on the identifier;
    command the memory device to use particular features supported by the refresh control version;
    monitor access patterns to the memory device;
    detect a suspicious access pattern; and
    command the memory device to use more restrictive features supported by the refresh control version based on the detected suspicious access pattern.

14. The medium of claim 13, wherein the instructions to access the identifier comprise instructions to access the identifier at startup.

15. The medium of claim 13, further including instructions to:
    determine that the suspicious access pattern has subsided after further monitoring access patterns; and, in response thereto, command the memory device to use less restrictive features supported by the refresh control version.

16. The medium of claim 13, wherein the machine comprises a host coupled to the memory device; and
wherein the instructions to access the identifier comprise instructions to command the memory device to read a mode register of the memory device.

17. The medium of claim 13, wherein the machine comprises a host coupled to the memory device; and
wherein the instructions to access the identifier comprise instructions to read a serial presence detect hub of the memory device.

18. The medium of claim 13, wherein the instructions to lookup features supported by the refresh control version comprise instructions to lookup the features in firmware for the memory device; and
further comprising instructions to select the particular features from the features supported by the refresh control version.

19. A method, comprising:
operating a memory device with a set of refresh control features;
reading a mode register that stores an identifier of a version of the set of refresh control features;
transmitting the identifier to a host;
receiving a command from the host to change at least one of the set of refresh control features;
receiving a valid key entry sequence from the host prior to receiving the command to change the at least one refresh control feature;
writing a value indicative of the changed refresh control feature to the mode register in response to receiving the command to change the at least one refresh control feature and in response to receiving the valid key entry sequence; and
operating the memory device with the changed set of refresh control features.

20. The method of claim 19, further comprising:
receiving a subsequent command to change at least one of the set of refresh control features without receiving the valid key entry sequence from the host immediately prior to receiving the subsequent command; and
not executing the subsequent command.

* * * * *